US012644944B2

(12) United States Patent
Setsompop et al.

(10) Patent No.: US 12,644,944 B2
(45) Date of Patent: Jun. 2, 2026

(54) SEMI-SUPERVISED ML-SYNTHESIS FOR TIME-RESOLVED IMAGING

(71) Applicant: The Board of Trustees of the Leland Stanford Junior University, Stanford, CA (US)

(72) Inventors: Kawin Setsompop, Stanford, CA (US); Congyu Liao, Union City, CA (US); Cagan Alkan, Redwood City, CA (US); Mahmut Yurt, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 160 days.

(21) Appl. No.: 18/731,321

(22) Filed: Jun. 2, 2024

(65) Prior Publication Data

US 2024/0402276 A1     Dec. 5, 2024

Related U.S. Application Data

(60) Provisional application No. 63/470,720, filed on Jun. 2, 2023.

(51) Int. Cl.
*G01R 33/56* (2006.01)
*G01R 33/561* (2006.01)

(52) U.S. Cl.
CPC ....... *G01R 33/5608* (2013.01); *G01R 33/561* (2013.01)

(58) Field of Classification Search
CPC ......................... G01R 33/5608; G01R 33/561
See application file for complete search history.

(56) References Cited

U.S. PATENT DOCUMENTS

| 10,527,699 B1 * | 1/2020 | Cheng ................. G06N 3/0895 |
| 2022/0221540 A1 * | 7/2022 | Fair .................... G01R 33/4824 |
| 2022/0222781 A1 * | 7/2022 | Jacob ...................... G06N 3/08 |

OTHER PUBLICATIONS

Yurt et al. "Semi-Supervised Learning of Mutually Accelerated MRI Synthesis without Fully-Sampled Ground Truths" (Year: 2021).*
Yur et al., Unlocking Data-Consistent Synthesis of Clinical Contrasts from Magnetic Resonance Fingerprinting with Semi-Supervised Learning. ISMRM May 2024.
Yur et al., Semi-Supervision for Clinical Contrast-Weighted Image Synthesis from Magnetic Resonance Fingerprinting. ISMRM Jun. 2023.

* cited by examiner

*Primary Examiner* — Gregory H Curran
(74) *Attorney, Agent, or Firm* — LUMEN PATENT FIRM

(57) ABSTRACT

A method for magnetic resonance imaging acquires time-resolved k-space data by a magnetic resonance imaging apparatus, and generates contrast-weighted images by a multi-task generator G from the time-resolved k-space data. The multi-task generator G comprises a deep learning neural network trained using prospectively under-sampled ground truth images acquired using an acceleration factor of at least 8 without any fully-sampled ground truth images. The multi-task generator G is also trained using a physics guidance model and a semi-supervised loss function.

9 Claims, 4 Drawing Sheets

Semi-Supervised Learning

*Fig. 1A*

Fully-Supervised Learning

*Fig. 1B*

Semi-Supervised Learning

*Fig. 2B*

T₂-Cube Synthesis

Ground Truth | fsMRF (R=1) | ssMRF (R=4) | ssMRF (R=8)

*Fig. 2A*

T₁-MPRAGE Synthesis

Ground Truth | fsMRF (R=1) | ssMRF (R=4) | ssMRF (R=8)

SEMI-SUPERVISED ML-SYNTHESIS FOR TIME-RESOLVED IMAGING

CROSS-REFERENCE TO RELATED APPLICATIONS

This application claims priority from U.S. Provisional Patent Application 63/470,720 filed Jun. 2, 2023, which is incorporated herein by reference.

STATEMENT OF FEDERALLY SPONSORED RESEARCH

This invention was made with Government support under contracts EB025162, EB030006, and MH116173 awarded by the National Institutes of Health. The Government has certain rights in the invention.

FIELD OF THE INVENTION

The present invention relates generally to magnetic resonance imaging. More specifically, it relates to methods for generating contrast-weighted images from the time-resolved k-space data.

BACKGROUND OF THE INVENTION

Recent advances in time-resolved magnetic resonance imaging (MRI) such as magnetic resonance fingerprinting (MRF) and echo-planar time-resolved imaging (EPTI) have enabled high-resolution, whole-brain protocols that can quantify tissue parameters ($T_1$, $T_2$, PD maps etc.). Although tissue quantification has potential in clinical applications, radiologists often require contrast-weighted structural images ($T_1$-weighted, $T_2$-weighted, FLAIR etc.) for accurate diagnostics. Unlike time-resolved imaging which can be acquired in just a few minutes, contrast-weighted exams can take up to ~20-40 minutes. A natural approach to bypass the contrast scans is to use Bloch equations to synthesize contrast-weighted images from quantitative maps. However, physics-based synthesis typically suffers from incomplete modeling of the acquisition, and magnetization transfer effects might become difficult to estimate. Therefore, several studies have introduced data-driven methods to learn the underlying synthesis. While these models consistently demonstrate success, they undesirably rely on full supervision from fully-sampled ground truths of the contrasts, so they demand training sets of paired, high-quality quantitative maps and contrast-weighted images. Note that compiling such datasets proves impractical even for training purposes, particularly across diverse clinical populations needed to ensure building robust models.

SUMMARY OF THE INVENTION

Previous techniques for synthesis in time-resolved imaging rely on supervision from fully-sampled ground truths for model training. However, the collection of such fully-sampled acquisitions involves impractically long scans (~20-40 min), and this prohibits the compilation of training data from diverse clinical populations. In contrast, the present technique enables learning of synthesis from heavily under-sampled acquisitions. This suggests that 30 second-3 minute data acquisitions can be obtained and still the exact same mapping can be learned. This increases the comfort of the patients and decreases the scan costs. Furthermore, due to the increased feasibility of these shorter scans, training data are compiled from more diverse populations, resulting in development of more robust and generalizable network models.

Time-resolved and quantitative imaging methods have the potential in providing rapid clinical scans with conventional clinical (contrast weighted) structural images. However, this potential can only be fully realized if high quality clinical images can be synthesized from these data, which currently require large training dataset of diverse pathologies. The approach disclosed here can be used to enable much more time- and cost-efficient acquisition of such training data.

It is of great interest to develop methods that can be trained via heavily under-sampled data that can be feasibly collected across diverse populations. The inventors have developed a semi-supervised model that introduces a training framework with highly accelerated acquisitions of clinical contrasts, reducing scan time requirements for training data. Contrary to previous fully-supervised models that define a supervised loss on the entire k-space, the model of the present technique leverages a semi-supervised loss based only on acquired k-space points of heavily accelerated acquisitions. This loss definition is based on physics-guidance of the acquisition system, including under-sampling pattern and coil sensitivities. For homogenous learning in k-space, the method further utilizes complementary sampling masks across different training subjects and contrasts, and involves a multi-task learning framework with network weight-sharing to synergistically synthesize multiple contrasts. A key benefit of the method is then compilation of training data per subject of only 30 seconds to 2 minutes, compared to the previous fully-supervised models that require training data of 30-40 minutes per subject, enabling time- and cost-efficient acquisition of diverse training datasets over healthy and pathological populations.

In one embodiment the method includes receiving as input time-resolved acquisitions. The method learns to estimate the corresponding contrast-weighted images. To do this, the method involves a multi-task generator, G, that jointly synthesizes the clinical contrasts $\hat{Y}=\{\hat{y}_1, \hat{y}_2, \ldots, \hat{y}_n\}$ from time-resolved acquisitions, X, such that $G(X)=\hat{Y}$. Since ground truth contrast-weighted images used here for training come from accelerated acquisitions, they have aliasing artifacts that prohibit the use of supervised loss functions. To overcome this, the method utilizes a physics-guidance module, denoted as A, to generate under-sampled multi-coil counterparts, such that, $\hat{Y}_A=A(G(X))$.

This physics module involves under-sampling in k-space and projection of coil sensitivities. Once the under-sampled, multi-coil counterparts are generated, the semi-supervised loss function in terms of, including, but not limited to, k-space, image, and adversarial domains between the synthesized and acquired multi-coil images is defined. To ensure homogenous learning across k-space points, randomized sampling masks were leveraged. These sampling masks enforce complementariness in such a way that same k-space locations are enforced not to be acquired across different contrast and subjects. Complementary nature of the sampling masks allows equalized learning across k-space since different k-space points from different masks contribute to overall semi-supervised loss. Also, a calibration region was included to each mask, as having a calibration region in masks is critical since most energy in k-space lies in low-frequency regions; providing this information to synthesis network better conditions the problem.

In one aspect, a method for magnetic resonance imaging comprises a) acquiring time-resolved k-space data by a magnetic resonance imaging apparatus; b) generating contrast-weighted images by a multi-task generator G from the time-resolved k-space data; wherein the multi-task generator G comprises a deep learning neural network trained using prospectively under-sampled ground truth images acquired using an acceleration factor of at least 8 without any fully-sampled ground truth images, wherein the multi-task generator G is trained using a physics guidance model and a semi-supervised loss function. The multi-task generator G is preferably trained by generating under-sampled multi-coil counterpart images from the contrast-weighted images using a physics guidance model, and evaluating a semi-supervised loss function between the under-sampled multi-coil counterpart images and the prospectively under-sampled ground truth images acquired using an acceleration factor of at least 8. The physics guidance model preferably comprises under-sampling in k-space using k-space sampling masks and projection of coil sensitivities. The k-space sampling masks may be complementary Poisson disc masks, for example, variable density Poisson disc sampling masks with calibration regions for each contrast and subject. The semi-supervised loss function preferably comprises a combination of a Fourier domain loss function between the under-sampled multi-coil counterpart images and the under-sampled ground truth images, an image domain loss function between the under-sampled multi-coil counterpart images and the under-sampled ground truth images, and an adversarial domain loss function using a discriminator that distinguishes between the under-sampled multi-coil counterpart images and the under-sampled ground truth images. The multi-task generator G in one embodiment comprises: a shared encoder of 3 convolutional layers; a shared vision transformer block; 3 shared ResNet blocks; a shared ViT block; 3 shared ResNet blocks; non-shared VIT block; a non-shared decoder of 3 convolutional layers; and a separate decoder of 5 convolutional layers for each contrast image. The acquired time-resolved k-space data may be magnetic resonance fingerprinting data or echo planar time-resolved imaging data.

BRIEF DESCRIPTION OF THE DRAWINGS

FIG. 1A is a processing pipeline illustrating the use of a traditional fully-supervised model for training and inference of output contrast images from input magnetic resonance fingerprinting (MRF) data.

FIG. 1B is a processing pipeline illustrating the use of semi-supervised model for training and inference of output contrast images from input magnetic resonance fingerprinting (MRF) data, according to an embodiment of the invention.

Figures 2A, 2B:
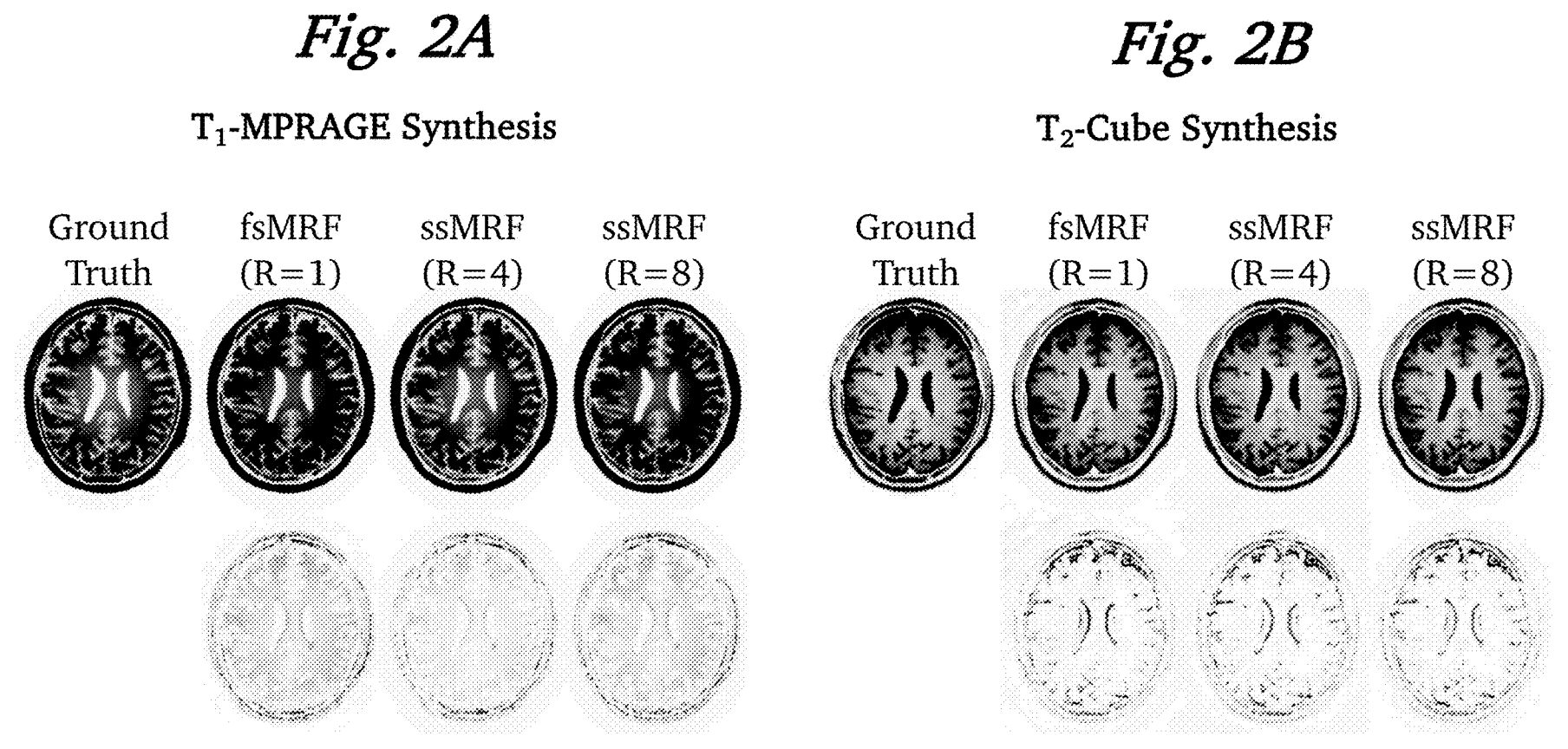

FIG. 2A shows synthesized images from the ssMRF and fsMRF models along with the error maps for a reference image for $T_1$-MPRAGE synthesis.

FIG. 2B shows synthesized images from the ssMRF and fsMRF models along with the error maps for a reference image for $T_2$-Cube synthesis.

DETAILED DESCRIPTION OF THE INVENTION

Figure 3:
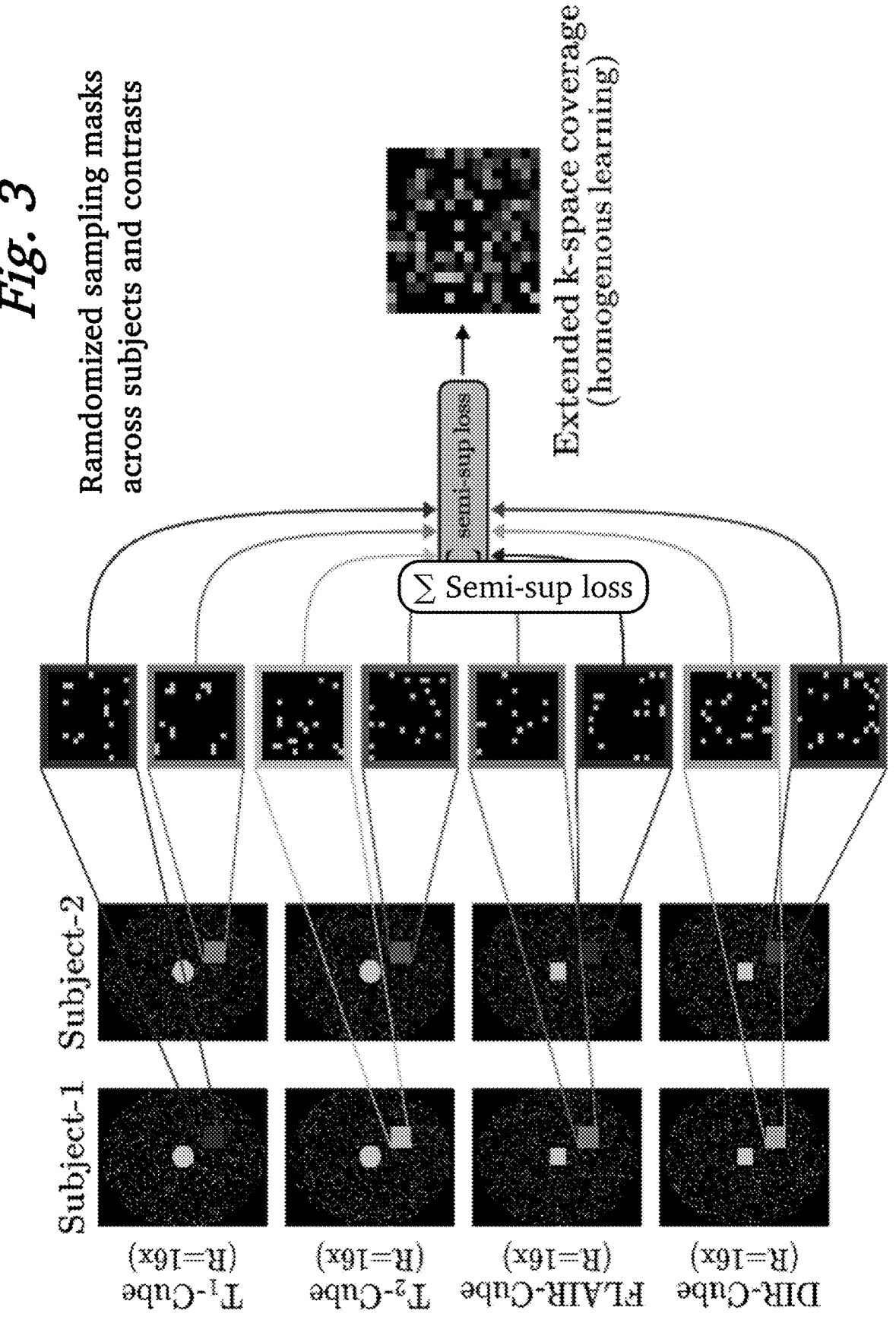
FIG. 3 illustrates the use of randomized sampling masks across subjects and contrasts, according to an embodiment of the invention.

Deep learning models have been used to synthesize clinical contrast-weighted images from magnetic resonance fingerprinting (MRF) data acquisitions. While this approach can provide high synthesis quality, the training of the model requires supervision using fully-sampled training data of clinical contrasts that are challenging to collect due to scan time considerations. To avoid reliance on full supervision, here we disclose a semi-supervised model (ssMRF) that can be trained directly using clinical contrast data obtained with accelerated acquisition. To achieve this, we use a semi-supervised loss function based only on acquired k-space samples of target contrasts. Preferably, the approach further leverages complementary Poisson disc masks in a multi-task learning framework for synergistic synthesis of multiple contrasts. Retrospective experiments demonstrate the efficacy of ssMRF where the method yields high-quality synthesis performance across different clinical contrasts on par with the fully-supervised alternative.

Magnetic resonance fingerprinting (MRF) is a rapid quantitative imaging modality that uses time-varying acquisition parameters to quantify tissues in a single exam session. MRF leverages a tailored pulse sequence that deliberately alters scan parameters over time. As a result, voxels with distinct tissue characteristics produce unique signal evolutions, akin to fingerprints, when exposed to the MRF sequence. The acquired fingerprints are matched against a precalculated dictionary of simulated signal evolutions, typically utilizing maximum correlation matching. The matching process allows for the quantification of tissue parameters, such as $T_1$, $T_2$, and $B_0$, resulting in a comprehensive set of quantitative maps of the underlying anatomy.

While tissue quantification provided by MRF has clinical potential, radiologists often require contrast-weighted images (e.g., $T_1$-, $T_2$-weighted) for accurate diagnostics. Unlike MRF which can be acquired in 3-5 minutes at high-resolution across the whole brain, clinical contrasts involve protocols that can take 40-60 minutes. This has motivated the development of deep learning neural network models that learn to synthesize contrast-weighted images from fast MRF acquisitions (input: MRF, output: contrasts).

Figure 1A:
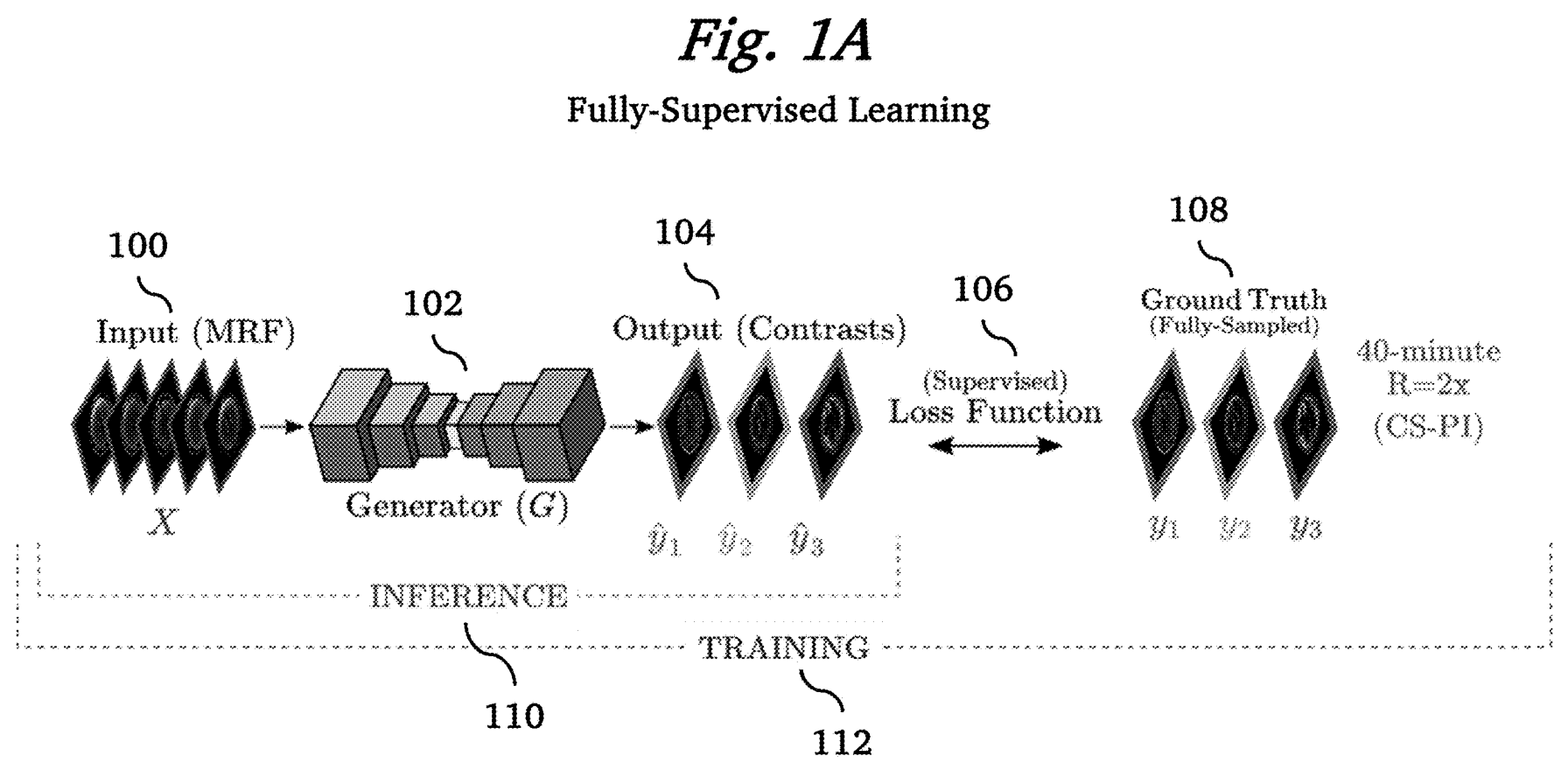

FIG. 1A is a processing pipeline illustrating the use of a traditional fully-supervised deep learning model for training 112 and inference 110 of output contrast images from input magnetic resonance fingerprinting (MRF) data. In an MRI scan, input MRF coefficient data 100 is obtained. This data 100 is input to a generator deep learning neural network 102 which outputs multiple contrast images 104. During training, these output contrasts 104 are compared with fully-sampled ground truth contrast images 108 using a supervised loss function 106. The loss function is used to train the generator 102 using backpropagation.

Although these methods demonstrated success in synthesis, they undesirably relied on full supervision from ground truth contrast images 108, hence required a training set of paired, high-quality MRF and clinical contrast data 100 derived from fully-sampled scans. However, compilation of such datasets becomes impractical even for training purposes due to prolonged scans of clinical contrasts.

To address these limitations, the present technique provides a semi-supervised model (ssMRF) that enables a training procedure with accelerated acquisitions of clinical contrasts, thus reducing the scan-time requirements for training data collection. As opposed to conventional supervised models that define a loss on the entire k-space of the contrast data (or the corresponding image-domain data), embodiments of the invention use a semi-supervised loss function based only on the acquired k-space points of the accelerated acquisitions. For homogeneous learning across k-space, our technique further leverages complementary Poisson disc masks across distinct training subjects and contrasts, via a multi-task learning framework to synergistically synthesize multiple distinct contrasts from MRF acquisitions.

Figure 1B:
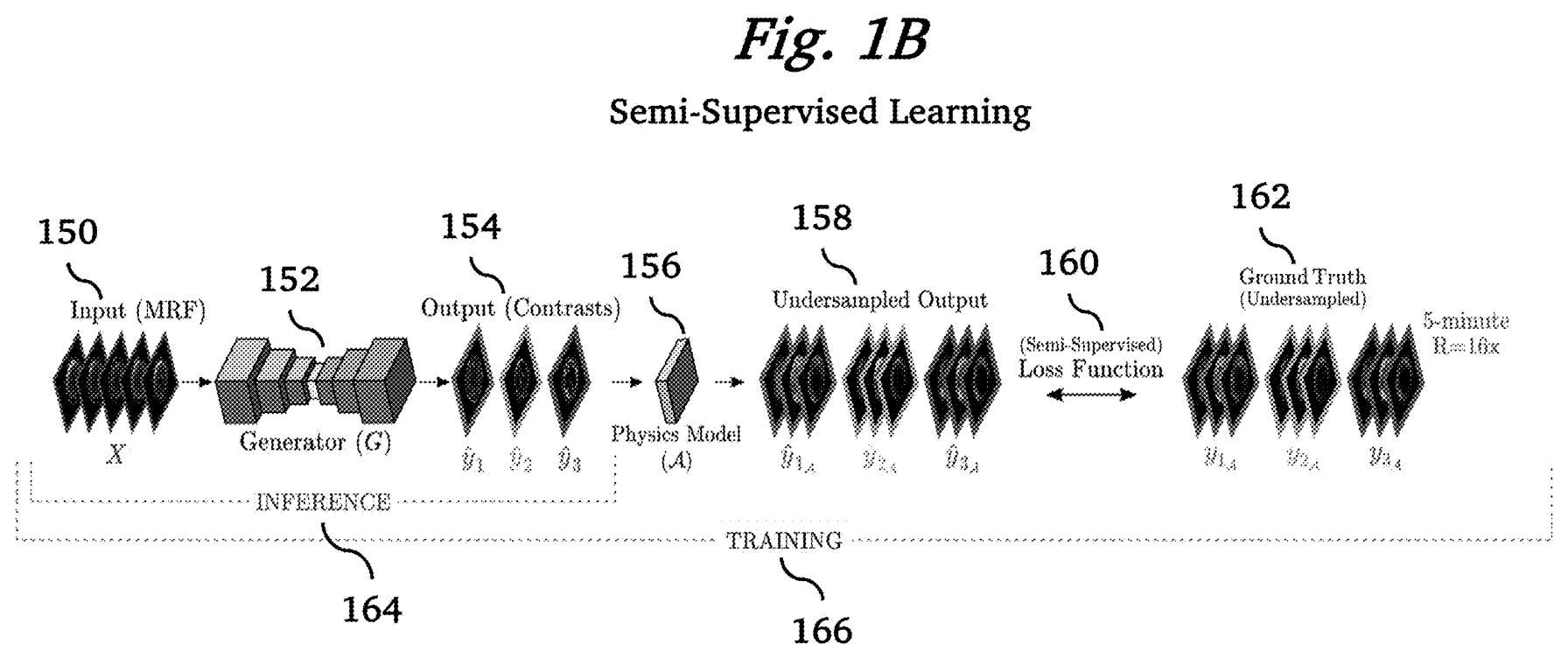

FIG. 1B is a processing pipeline according to an embodiment of the invention illustrating the use of semi-supervised model for training 166 and inference 164 of output contrast-weighted images from input magnetic resonance fingerprinting (MRF) data. In an MRI scan, input MRF coefficients 150 are obtained in an acquisition through subspace-reconstruction. This data 150 is input to a generator deep learning neural network 152 which outputs multiple contrast images 154. The contrast images 154 are processed by a physics model 156 to produce under-sampled output images 158. The physics-module that mimics the coil projection and under-sampling of the accelerated ground truths. During training, the under-sampled output contrast images 158 are compared with under-sampled ground truth contrast images 162 using a semi-supervised loss function 160. The loss function is used to train the generator 152 using backpropagation.

The present ssMRF model involves a multi-task generator G 152 based on vision transformers that jointly synthesizes multiple clinical contrasts $\hat{Y}=\{\hat{y}_1, \hat{y}_2, \ldots, \hat{y}_n\}$ 154 from MRF coefficient images X 150, such that $G(X)=\hat{Y}$. The ground truth contrast images 162 used here for training are obtained from accelerated acquisitions (e.g., 5 minutes, acceleration factor R=16×). The under-sampled images 158 suffer from severe aliasing artifacts that prohibit use of supervised loss functions between synthesized images 158 and accelerated references 162. To address this, ssMRF utilizes a physics-based module A 156, to generate under-sampled multi-coil synthesized counterparts, such that $$\hat{Y}_{\hat{A}} = A(G(X)) = F^{-1}P_Y F C_Y G(X),$$

where $Y_{\hat{A}}$ denotes synthesized under-sampled multi-coil accelerated counterpart images 158, $C_Y$ denotes coil sensitivity maps, $P_Y$ denotes k-space sampling masks, and F, $F^{-1}$ denote forward and inverse Fourier transforms, respectively.

The semi-supervised loss function is defined selectively on acquired k-space points of the ground truth contrasts (i.e., on the k-space coefficients within sapling masks of the contrasts). We define Fourier, image, and adversarial domain sub-losses that contribute to the overall semi-supervised loss function as follows.

Fourier Domain Loss: A k-space loss function between the synthesized and reference (ground truth) target images is defined on the acquired k-space points:

$$L_F = E_{X,Y}[\|\|F(AG(X) - Y)\|_1].$$

Image Domain Loss: To improve robustness, ssMRF penalizes the difference between image domain data of accelerated references and synthesized counterparts:

$$L_I = E_{X,Y}[\|\|AG(X) - Y\|_1].$$

Adversarial Domain Loss: An adversarial loss via a discriminator is utilized to improve the level of realism in the synthesized images:

$$L_A = -E_Y[(D(Y) - 1)^2] - E_X[D(AG(X))],$$

where discriminator D distinguishes between synthesized and acquired images of the clinical contrasts.

To define the semi-supervised loss function, these sub-loss functions are combined to form the final objective function in a min-max game between the generator and the discriminator:

$$\min_G \max_D \{\lambda_F L_F + \lambda_I L_I + \lambda_A L_A\}.$$

where $\lambda_F$, $\lambda_I$, $\lambda_A$, are the weighting of the k-space, image, and adversarial losses, respectively.

Dataset

In-house dataset of MRF and five clinical contrasts ($T_1$-MPRAGE, $T_1$-Cube, $T_2$-Cube, $T_2$-FLAIR, DIR-Cube) was acquired from 12 healthy volunteers, with 8 used for training, 2 for validation, and 2 for testing. MRF data were acquired on a GE Premier scanner via 3D tiny golden angle shuffling spiral projection with a total of 48 groups, yielding a total acquisition time of 5 minutes 57.6 seconds. Preprocessing of MRF was performed via spatiotemporal subspace modeling with locally low rank recovery. Clinical contrasts were also acquired on a GE Premier scanner via MPRAGE and Cube sequences with a total acquisition time of 40 minutes, stated for fully-sampled acquisitions used here for retrospective demonstrations, whereas prospective R=8 acceleration would take 5 minutes; being manageable to insert as an additional scan at patient exams to allow large training dataset collection.

Undersampling Mask Design

We leveraged complementary Poisson disc (CPD) sampling, which extends the typical two-dimensional Poisson disc sampling to temporal dimension. It enforces complementariness in the sense that the same k-space points are not acquired in multiple time frames. Here, we treated sampling masks for different subjects and contrasts as masks from different time points in CPD. Consequently, a unique variable density Poisson disc sampling mask with a calibration region is used for each contrast and subject. Having a calibration region in the masks is critical as most of the energy in k-space lies in the low frequency region; providing this information to the synthesis network better conditions the problem. In addition, the complementary nature of the sampling masks allows homogeneous learning across k-space regions since different k-space points from different subjects and contrasts contribute to the overall semi-supervised loss function.

The semi-supervised loss function is defined only on the acquired k-space coefficients of the contrast-weighted acquisitions. Therefore, using the same sampling mask across the training subjects and contrasts would result in the network to learn to recover only the k-space points within this sampling mask. To avoid this, we implemented uniform random sampling masks that are varied across the subjects and contrasts. This randomization enabled the semi-supervised loss function, when summed across the subjects and 56 contrasts, spread across all possible k-space locations. For each sampling mask, we included a calibration region of size 12×12. Having the calibration region is important as most energy in k-space lies in low-frequency regions; providing this information to the synthesis network better conditions the learning problem.

In sampling masks, randomness across different subjects and contrasts ensures semi-supervised loss spread across all possible k-space locations. Therefore, we developed uniform random sampling in four clinical contrast-weighted sequences: T1-Cube, T2-Cube, FLAIR-Cube, DIR-Cube. Echo-train lengths and mask ordering were carefully tuned for each sequence to capture correct contrasts. FIG. 3 illustrates the use of randomized sampling masks across subjects and contrasts, according to an embodiment of the invention. Sampling masks that are uniform randomly generated are displayed for four clinical contrasts and for two subjects. Randomization in sampling masks across contrasts and subjects helps extend k-space coverage for the semi-supervised loss.

Implementation Details

In one embodiment, multi-task generator G is composed of a shared encoder of 3 convolutional layers, a shared vision transformer (ViT) block, 3 shared ResNet blocks, a shared ViT block, 3 shared ResNet blocks, followed by a non-shared ViT block and a non-shared decoder of 3 convolutional layers for each output contrast. A separate decoder of 5 convolutional layers was also used for each contrast. Since ViT is a pre-trained architecture, remaining layers were first pre-trained, followed by joint training of all network layers. The total number of epochs was 100 for both pre-training and joint training with early stopping based on validation set performance. Learning rate was set to 0.0002 in the first 50 epochs, and linearly decayed to 0 in the last 50 epochs. The relative ratio of the Fourier, image, and adversarial domain loss functions were set as (2000,50,1) based on validation assessments.

models along with the error maps for a reference image for $T_1$-MPRAGE synthesis, and FIG. 2B shows synthesized images from the ssMRF and fsMRF models along with the error maps for a reference image for $T_2$-Cube synthesis.

The invention claimed is:

1. A method for magnetic resonance imaging comprising:
   a) acquiring time-resolved k-space data by a magnetic resonance imaging apparatus;
   b) generating contrast-weighted images by a multi-task generator G from the time-resolved k-space data;
   wherein the multi-task generator G comprises a deep learning neural network trained using prospectively under-sampled ground truth images acquired using an acceleration factor of at least 8 without any fully-sampled ground truth images, wherein the multi-task generator G is trained using a physics guidance model and a semi-supervised loss function.

2. The method of claim 1 wherein the multi-task generator G is trained by
   a) generating under-sampled multi-coil counterpart images from the contrast-weighted images using a physics guidance model;
   b) evaluating a semi-supervised loss function between the under-sampled multi-coil counterpart images and the prospectively under-sampled ground truth images acquired using an acceleration factor of at least 8.

3. The method of claim 2 wherein the physics guidance model comprises:
   a) under-sampling in k-space using k-space sampling masks;
   b) projection of coil sensitivities.

TABLE 1

| | | | | | | | | | | |
|---|---|---|---|---|---|---|---|---|---|---|
| Quantitative image quality metrics comparing ssMRF (R = 4, 8) and fsMRF (R = 1) for the five clinical contrasts in the dataset. | | | | | | | | | | |
| | $T_1$-MPRAGE | | $T_1$-CUBE | | $T_2$-CUBE | | $T_2$-DIR | | $T_2$-FLAIR | |
| | PSNR | SSIM | PSNR | SSIM | PSNR | SSIM | PSNR | SSIM | PSNR | SSIM |
| ssMRF (R = 4) | 24.39 ± 1.46 | 86.6 ± 4.284 | 25.46 ± 1.32 | 89.86 ± 3.86 | 26.20 ± 1.70 | 85.86 ± 5.21 | 23.53 ± 1.26 | 77.97 ± 4.52 | 24.85 ± 1.71 | 85.11 ± 3.98 |
| ssMRF (R = 8) | 24.24 ± 1.14 | 87.18 ± 3.61 | 25.46 ± 1.34 | 89.78 ± 4.02 | 26.29 ± 1.58 | 88.81 ± 4.00 | 23.42 ± 1.52 | 78.47 ± 4.63 | 24.50 ± 1.96 | 85.74 ± 4.06 |
| fsMRF (R = 1) | 24.42 ± 1.20 | 88.47 ± 3.50 | 26.09 ± 1.48 | 91.39 ± 3.79 | 26.32 ± 1.78 | 86.96 ± 6.51 | 23.08 ± 1.42 | 77.68 ± 4.21 | 24.42 ± 1.90 | 87.45 ± 3.53 |

We trained two independent ssMRF models for clinical contrast acceleration factors of R=4 and R=8, denoted as ssMRF (R=4) and ssMRF (R=8), respectively. We then compared them against a fully-supervised alternative (R=1), namely fsMRF. Note that fsMRF was trained using fully-sampled acquisitions of the clinical contrasts, whereas the ssMRF models did not have access to full k-space data during training. PSNR and SSIM measurements between the synthesized and clinical target images in the test set for all five contrasts are reported in Table 1. The reported measurements indicate that the proposed ssMRF models yield equivalent performance with the fully-supervised fsMRF model despite being trained on accelerated acquisitions with missing k-space samples. Representative results from an example slice in the test dataset displayed in FIGS. 2A, 2B also validate that the proposed ssMRF models with varying acceleration ratios yield qualitatively identical performance compared to the fully-supervised fsMRF. Specifically, FIG. 2A shows synthesized images from the ssMRF and fsMRF 4. The method of claim 3 wherein the k-space sampling masks are complementary Poisson disc masks.

5. The method of claim 3 wherein the k-space sampling masks are variable density Poisson disc sampling masks with calibration regions for each contrast and subject.

6. The method of claim 2 wherein the semi-supervised loss function comprises a combination of:
   a) a Fourier domain loss function between the under-sampled multi-coil counterpart images and the under-sampled ground truth images;
   b) an image domain loss function between the under-sampled multi-coil counterpart images and the under-sampled ground truth images;
   c) an adversarial domain loss function using a discriminator that distinguishes between the under-sampled multi-coil counterpart images and the under-sampled ground truth images.

7. The method of claim 1 wherein the multi-task generator G comprises:

a) a shared encoder of 3 convolutional layers;

b) a shared vision transformer block;

c) 3 shared ResNet blocks;

d) a shared ViT block;

e) 3 shared ResNet blocks;

f) non-shared ViT block;

g) a non-shared decoder of 3 convolutional layers;

h) a separate decoder of 5 convolutional layers for each contrast image.

8. The method of claim 1 wherein the acquired time-resolved k-space data is magnetic resonance fingerprinting data.

9. The method of claim 1 wherein the acquired time-resolved k-space data is echo planar time-resolved imaging data.

\* \* \* \* \*